(12) United States Patent
Jahagirdar et al.

(10) Patent No.: US 11,721,554 B2
(45) Date of Patent: Aug. 8, 2023

(54) STRESS COMPENSATION FOR WAFER TO WAFER BONDING

(71) Applicant: Intel Corporation, Santa Clara, CA (US)

(72) Inventors: Anant Jahagirdar, Hillsboro, OR (US); Chytra Pawashe, Beaverton, OR (US); Aaron Lilak, Beaverton, OR (US); Myra McDonnell, Portland, OR (US); Brennen Mueller, Portland, OR (US); Mauro Kobrinsky, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 993 days.

(21) Appl. No.: 16/356,402

(22) Filed: Mar. 18, 2019

(65) Prior Publication Data

US 2020/0303191 A1 Sep. 24, 2020

(51) Int. Cl.

| | |
|---|---|
| H01L 29/78 | (2006.01) |
| H01L 29/10 | (2006.01) |
| H01L 29/66 | (2006.01) |
| H01L 29/161 | (2006.01) |
| H01L 21/20 | (2006.01) |
| H01L 21/56 | (2006.01) |
| H01L 21/02 | (2006.01) |
| H01L 21/603 | (2006.01) |

(52) U.S. Cl.
CPC ...... *H01L 21/2007* (2013.01); *H01L 21/0226* (2013.01); *H01L 21/56* (2013.01); *H01L 21/603* (2021.08)

(58) Field of Classification Search
CPC ............. H01L 29/7842; H01L 27/1203; H01L 2924/3511
See application file for complete search history.

(56) References Cited

U.S. PATENT DOCUMENTS

| | | | | |
|---|---|---|---|---|
| 6,756,285 B1 * | 6/2004 | Moriceau | ............. | H01L 21/185 438/455 |
| 7,067,402 B2 * | 6/2006 | Matsumura | ....... | H01L 21/76243 438/480 |
| 9,437,680 B1 * | 9/2016 | Cheng | ............... | H01L 21/02532 |
| 11,201,057 B2 * | 12/2021 | Falk | .................. | H01L 21/31155 |

* cited by examiner

*Primary Examiner* — Anthony Ho
*Assistant Examiner* — David J Goodwin
(74) *Attorney, Agent, or Firm* — Schwabe, Williamson & Wyatt. P.C.

(57) ABSTRACT

Embodiments herein describe techniques for bonded wafers that includes a first wafer bonded with a second wafer, and a stress compensation layer in contact with the first wafer or the second wafer. The first wafer has a first stress level at a first location, and a second stress level different from the first stress level at a second location. The stress compensation layer includes a first material at a first location of the stress compensation layer that induces a third stress level at the first location of the first wafer, a second material different from the first material at a second location of the stress compensation layer that induces a fourth stress level different from the third stress level at the second location of the first wafer. Other embodiments may be described and/or claimed.

16 Claims, 7 Drawing Sheets

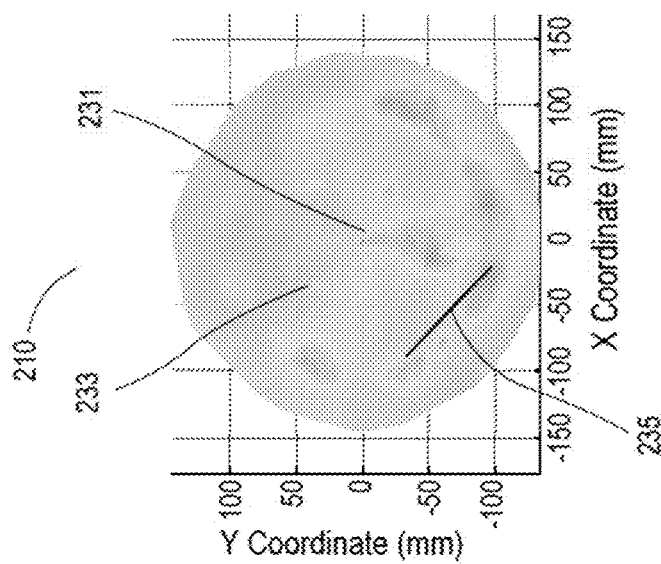
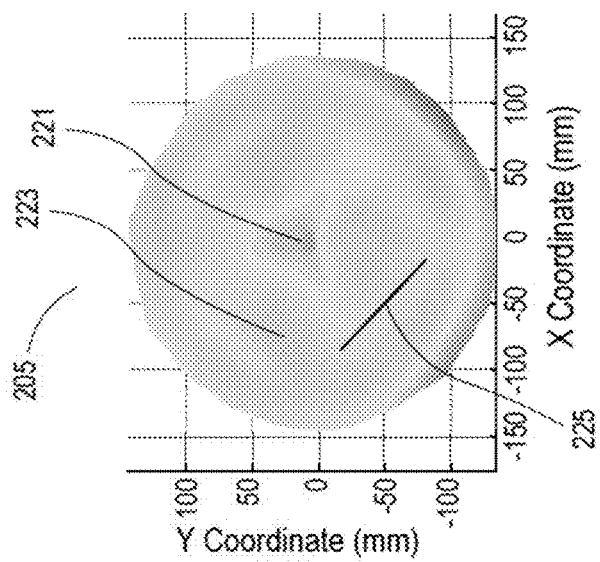
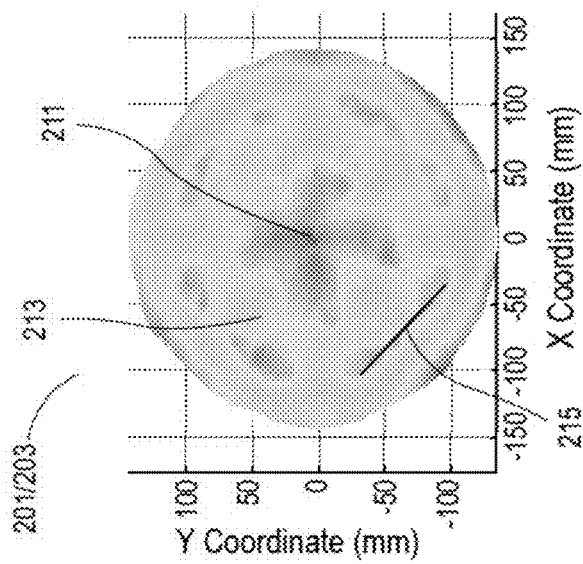

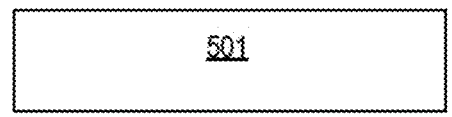
Figure 5(a)
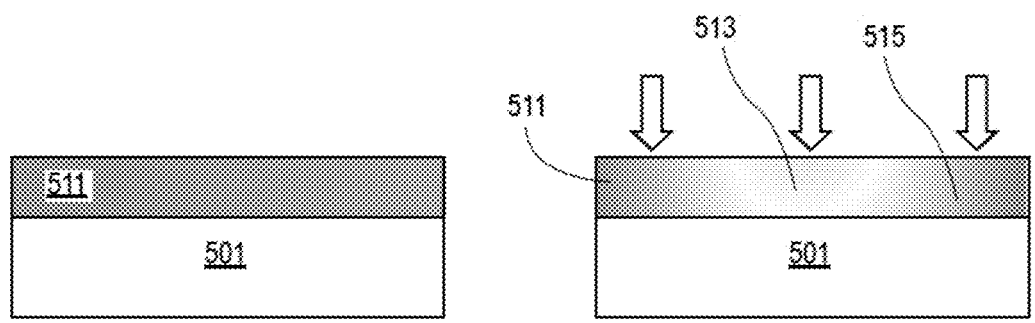
Figure 5(b)  Figure 5(c)
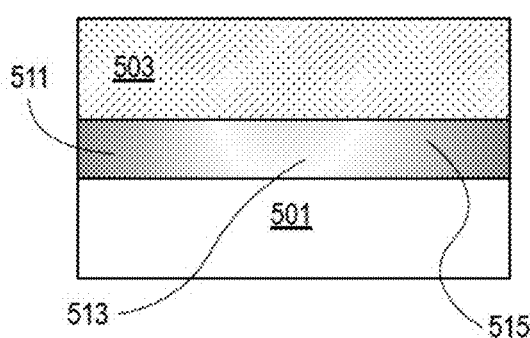 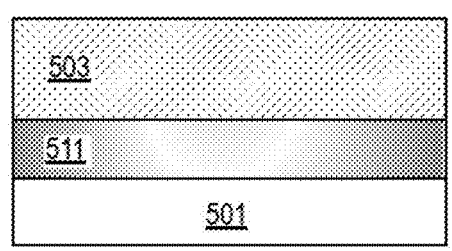
Figure 5(d)  Figure 5(e)

STRESS COMPENSATION FOR WAFER TO WAFER BONDING

FIELD

Embodiments of the present disclosure generally relate to the field of packaging, and more particularly, to wafer to wafer bonding.

BACKGROUND

Wafer bonding is a technology on wafer-level for the fabrication of microelectromechanical systems, nanoelectromechanical systems, microelectronics, or optoelectronics. In some wafer to wafer bonding, two wafers may be brought into close proximity to one another and bonding may be initiated by locally deforming one or both of the wafers to make local contact between the wafers. Such techniques may provide undesirable distortions in one or both of the wafers and/or undesirable stress between the wafers.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 2(a)-2(c) schematically illustrate diagrams of a stress compensation layer to compensate different stress levels at different locations resulted from bonding a first wafer and a second wafer, in accordance with some embodiments.

FIGS. 5(a)-5(e) schematically illustrate a process for forming a stress compensation layer to compensate different stress levels at different locations resulted from bonding a first wafer and a second wafer, in accordance with some embodiments.

DETAILED DESCRIPTION

Figure 1A:
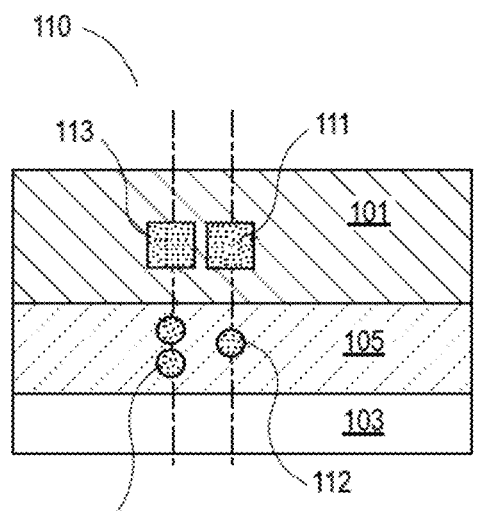
FIGS. 1(a)-1(d) schematically illustrate diagrams of a stress compensation layer to compensate different stress levels at different locations resulted from bonding a first wafer and a second wafer, in accordance with some embodiments.

Wafer bonding is a packaging technology on wafer-level for the fabrication of various mechanical, microelectronics, or optoelectronics systems. When one wafer is bonded to another wafer, non-uniformly distributed in-plane distortions (IPD) and stresses are generated in the wafers. Some solutions to reduce wafer bonding distortion may be based on adjusting tool settings in the existing wafer bonding equipments, e.g., adjusting the striker force, striker velocity, wafer gap, or vacuum chucking conditions. Some other solutions may change the wafer bonding tools or process steps. Such solutions may still not be able to completely remove IPD caused by wafer bonding. For example, the bonded wafers may still have a remaining IPD in the order of 10-100 nm.

Embodiments herein may provide methods and systems for correcting or compensating any remaining distortions occurred after wafer bonding. Embodiments herein may enable compensation of IPD residuals from wafer bonding, without significant changes to wafer bonding tools, wafer processing flows, or scanners or vacuum chucks. For bonded two wafers, there may be a non-uniformly distributed stress field at the surface of the two wafers. Embodiments herein may provide a stress compensation layer in contact with the first wafer or the second wafer to compensate the non-uniformly distributed stress at the surface of the bonded wafers. The stress compensation layer may have a non-uniformly distributed stress field to complement or compensate the stress field at the surface of the bonded wafers, so that the resulted overall stress field on the bonded wafers caused by the wafer bonding and the stress compensation layer may be evenly or substantial evenly distributed. The stress compensation layer may include some commonly used material such as $Si_3N_4$ or $SiO_2$, with additional impurities such as argon, xenon, or other ion impurities induced by an ion implant beam or lithography techniques. Embodiments herein may be highly adaptable to compensating different types of wafers and products and used in combination with current other solutions to correct the remaining IPDs on the bonded wafers. Embodiments herein may not change any tools or the bonding process, hence potentially having lower cost.

Embodiments herein may present an apparatus of bonded wafers that includes a first wafer, a second wafer bonded to the first wafer, and a stress compensation layer in contact with the first wafer or the second wafer. The first wafer has a first stress level at a first location of the first wafer, and a second stress level at a second location of the first wafer, where the second stress level is different from the first stress level. On the other hand, the stress compensation layer includes a first material at a first location of the stress compensation layer overlapping with the first location of the first wafer, a second material at a second location of the stress compensation layer overlapping with the second location of the first wafer. As a result, the stress compensation layer induces a third stress level at the first location of the first wafer, and a fourth stress level at the second location of the first wafer, where the third stress level is different from the fourth stress level, and the first material is different from the second material.

Embodiments herein may present a method for forming a semiconductor device including a first wafer and a second wafer bonded to the first wafer by wafer bonding. The method includes: providing a first wafer; forming a stress compensation layer in contact with the first wafer; and bonding the first wafer with a second wafer. The first wafer has a first stress level at a first location of the first wafer, and a second stress level at a second location of the first wafer, where the second stress level is different from the first stress level. The stress compensation layer includes a first material at a first location of the stress compensation layer overlapping with the first location of the first wafer, and a second material at a second location of the stress compensation layer overlapping with the second location of the first wafer. The stress compensation layer induces a third stress level at the first location of the first wafer, and a fourth stress level at the second location of the first wafer, where the third stress level is different from the fourth stress level, and the first material is different from the second material.

Embodiments herein may present a computing device including a first wafer, and a second wafer bonded to the first wafer by wafer bonding. The first wafer or the second wafer includes a processor or a memory device. A stress compensation layer is in contact with the first wafer or the second wafer. The first wafer has a first stress level at a first location of the first wafer, and a second stress level at a second location of the first wafer, where the second stress level is different from the first stress level. The stress compensation layer includes a first material at a first location of the stress compensation layer overlapping with the first location of the first wafer, and a second material at a second location of the stress compensation layer overlapping with the second location of the first wafer. The stress compensation layer induces a third stress level at the first location of the first wafer, and a fourth stress level at the second location of the first wafer. The first wafer has a sum stress level of the first location equal to the first stress level and the third stress level, and a sum stress level of the second location equal to the second stress level and the fourth stress level, the sum stress level of the first location is substantially same as the sum stress level of the second location.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. Circuitry may include one or more transistors. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1B:
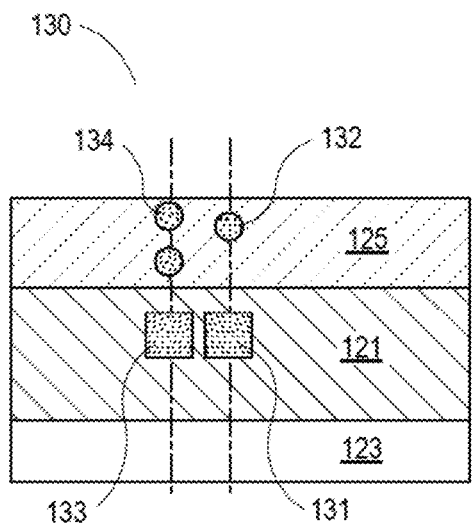
Figure 1C:
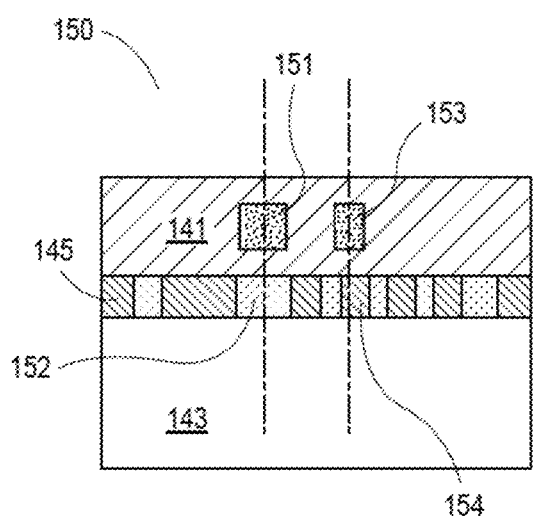

FIGS. 1(a)-1(d) schematically illustrate diagrams of a stress compensation layer to compensate different stress levels at different locations resulted from bonding a first wafer and a second wafer, in accordance with some embodiments. For example, as shown in FIG. 1(a), a stress compensation layer 105 is to compensate different stress levels at different locations, e.g., a location 111, a location 113, resulted from bonding a first wafer 101 and a second wafer 103. As shown in FIG. 1(b), a stress compensation layer 125 is to compensate different stress levels at different locations, e.g., a location 131, a location 133, resulted from bonding a first wafer 121 and a second wafer 123. As shown in FIG. 1(c), a stress compensation layer 145 is to compensate different stress levels at different locations, e.g., a location 151, a location 153, resulted from bonding a first wafer 141 and a second wafer 143.

In embodiments, as shown in FIG. 1(a), the first wafer 101 and the second wafer 103 are bonded together by wafer bonding to form a device 110. The first wafer 101 may have a thickness different from a thickness of the second wafer 103. In some other embodiments, the first wafer 101 may have a thickness same as a thickness of the second wafer 103. The first wafer 101 or the second wafer 103 may have a diameter range from 100 mm to 450 mm (4 inch to 17.7 inch), or some other sizes. The first wafer 101 or the second wafer 103 may be any kind of wafer, e.g., a silicon on insulator wafer, and may contain some semiconductor devices, e.g., a processor a memory device.

In embodiments, the second wafer 103 may be bonded to the first wafer 101 by any of the wafer bonding technologies, e.g., direct fusion bonding, direct bonding, vacuum wafer bonding, hybrid bonding, surface activated bonding, plasma activated bonding, anodic bonding, eutectic bonding, glass frit bonding, adhesive bonding, thermocompression bonding, reactive bonding, or transient liquid phase diffusion bonding. More details of wafer bonding may be described in FIGS. 5(a)-5(e). At the process of bonding the first wafer 101 and the second wafer 103, air in the gap between the first wafer 101 and the second wafer 103 may be pushed out to avoid voids after bonding. As a result, a stress is developed for the device 110, which is transferred to both wafers, and results in unwanted distortions. Such distortions may cause patterning errors and alignment difficulty in subsequent steps for the device 110.

Figure 1D:
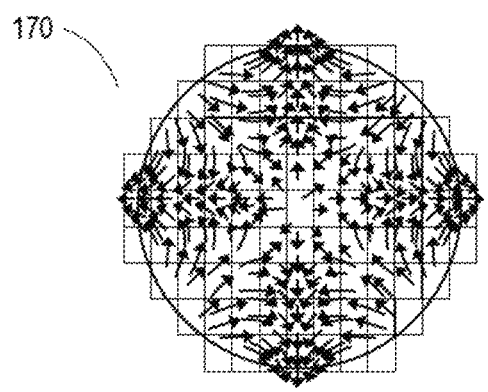

In embodiments, the device 110 formed by bonding the first wafer 101 and the second wafer 103 may have a non-uniformly distributed stress field at the surface of the two wafers. For example, the first wafer 101 has a first stress level at the location 111 of the first wafer 101, and a second stress level at the location 113 of the first wafer 101, where the second stress level is different from the first stress level. There may be many different locations at the first wafer 101 that may have different stress levels. For example, as shown in FIG. 1(d), a stress level at a location of the device 170 is shown by an arrow to indicate an in-plane stress displacement from an initially neutral position. There are many arrows to show the different stress levels of the device 170. In embodiments, the first stress level or the second stress level may be for a compressive stress or a tensile stress, and may be around 1 MPa to around 1000 MPa.

Figure 3C:
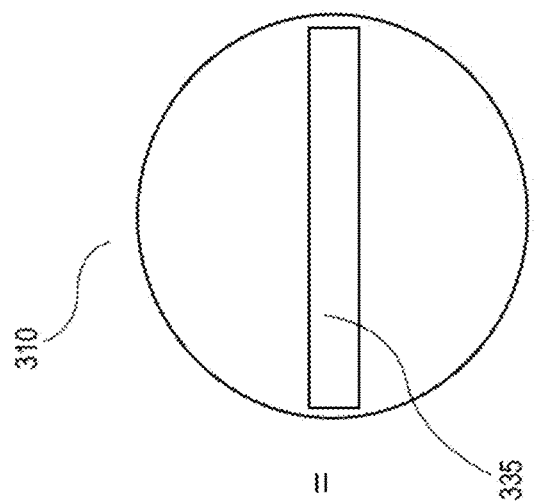
FIGS. 3(a)-3(c) schematically illustrate diagrams of a stress compensation layer to compensate different stress levels at different locations resulted from bonding a first wafer and a second wafer, in accordance with some embodiments.
Figure 3B:
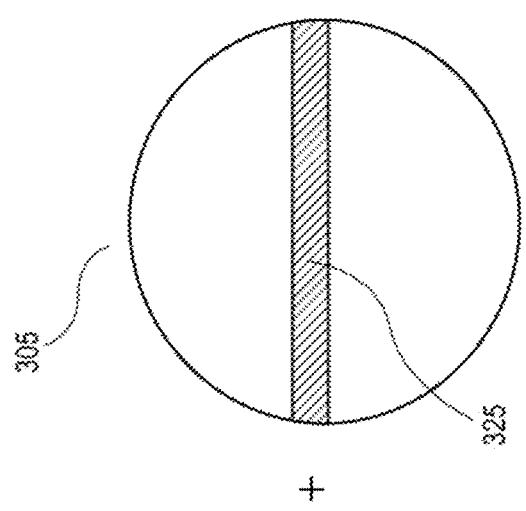
Figure 3A:
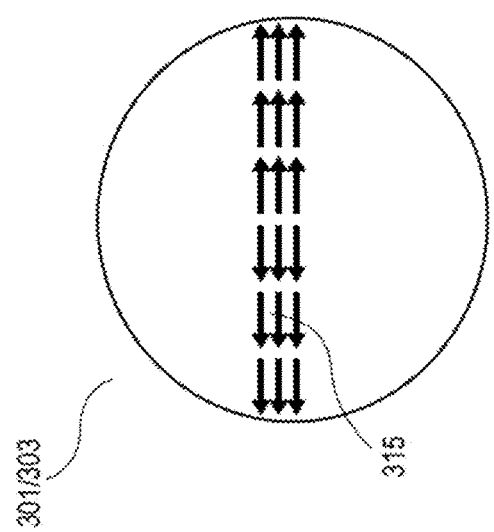

Embodiments herein may correct in-plane distortions on the bonded wafers by a stress compensation layer. In embodiments, the stress compensation layer 105 is between the first wafer 101 and the second wafer 103, and in contact with both the first wafer 101 and the second wafer 103. In some embodiments, the stress compensation layer 105 is in contact with an entire surface of the first wafer 101 or the second wafer 103. In some other embodiments, as shown in FIGS. 3(a)-3(c), the stress compensation layer may be in contact with a part of a surface of the first wafer or the second wafer. In some other embodiments, as shown in FIG. 1(b), the stress compensation layer 125 may be in contact with the first wafer or the second wafer, but not both.

In embodiments, the stress compensation layer 105 may be used to compensate the non-uniformly distributed stress field at the surface of the two wafers, e.g., the first wafer 101 or the second wafer 103. FIG. 1(a) only illustrates two locations, the location 111 and the location 113, as examples. The stress compensation layer 105 has a location 112 overlapping with the location 111 of the first wafer 101, and a location 114 overlapping with the location 113 of the first wafer 101. The stress compensation layer 105 may have a non-uniformly distributed stress field that is complement to the non-uniformly distributed stress field at the surface of the two wafers, e.g., the first wafer 101 or the second wafer 103. The non-uniformly distributed stress field of the stress compensation layer 105 may be generated by varying the materials at different locations of the stress compensation layer 105. For example, the stress compensation layer 105 includes a first material at the location 112, and a second material at the location 114, where the first material is different from the second material. As a consequence, the stress compensation layer 105 induces a third stress level at the location 111 of the first wafer 101, and a fourth stress level at the location 113 of the first wafer 101, where the third stress level is different from the fourth stress level. Similar to the first stress level or the second stress level, the third stress level or the fourth stress level may be for a compressive stress or a tensile stress, and may be around 1 MPa to around 1000 MPa.

In embodiments, the stress compensation layer 105 may include $Si_3N_4$, W, SiC, $SiO_2$, a ceramic film, a polymer film, or a metal film. The stress compensation layer 105 may have a thickness of around 100 nm to around 3000 nm. The first material at the location 112 or the first material at the location 114 may include argon, xenon, or ion impurity beneath a surface of the stress compensation layer 105. The argon, xenon, or ion impurity may have a concentration level of about $1*10^{15}$ to $1*10^{21}/cm^2$, and the concentration level varies with a depth to the surface of the stress compensation layer 105. Materials having a same impurity but different concentration levels may be considered as different materials. In some other embodiments, the stress compensation layer 105 further includes only the first material at the first location of the stress compensation layer, and only the second material at the second location of the stress compensation layer, as shown in FIG. 1(c). The first material includes a high stress material, and the second material includes a low stress material with a material stress constant lower than the first material.

In embodiments, as the result of the stress compensation layer 105, the first wafer 101 has a sum stress level of the location 111 equal to the first stress level and the third stress level, and a sum stress level of the location 113 equal to the second stress level and the fourth stress level. The sum stress level of the location 111 is substantially same as the sum stress level of the location 113. Hence, the stress compensation layer 105 corrects the non-uniformly distributed stress field at the surface of the two wafers, the first wafer 101 or the second wafer 103, to be uniformly distributed.

In some embodiments, there may be multiple layers of stress compensation layers to compensate the non-uniformly distributed stress field at the surface of the two wafers, the first wafer 101 or the second wafer 103, so that the device 110 may have a uniformly or substantially uniformly distributed stress field. For example, the stress compensation layer 105 may be a first stress compensation layer, and the device 110 further includes a second stress compensation layer in contact with the first wafer 101 or the second wafer 103. The second stress compensation layer may generate a fifth stress level at the location 111 of the first wafer 101, and a sixth stress level at the location 113 of the first wafer 101. The first wafer 101 has a sum stress level of the location 111 equal to the first stress level, the third stress level, and the fifth stress level, and a sum stress level of the location 113 equal to the second stress level, the fourth stress level, and the sixth stress level. The sum stress level of the location 111 is substantially same as the sum stress level of the location 113.

In embodiments, as shown in FIG. 1(b), a device 130 includes the first wafer 121 and the second wafer 123 bonded together. The first wafer 121 and the second wafer 123 may be similar to the first wafer 101 and the second wafer 103 shown in FIG. 1(a). The device 130 formed by bonding the first wafer 121 and the second wafer 123 may have a non-uniformly distributed stress field at the surface of the two wafers. For example, the first wafer 121 has a first stress level at the location 131 of the first wafer 121, and a second stress level at the location 133 of the first wafer 121, where the second stress level is different from the first stress level. In embodiments, the first stress level or the second stress level may be for a compressive stress or a tensile stress, and may be around 1 MPa to around 1000 MPa. In embodiments, the stress compensation layer 125 is in contact with the first wafer 121 only, but not the second wafer 123. The stress compensation layer 125 is in contact with an entire surface of the first wafer 121.

In embodiments, the stress compensation layer 125 may be used to compensate the non-uniformly distributed stress field at the surface of the two wafers, e.g., the first wafer 121 or the second wafer 123. The stress compensation layer 125 has a location 132 overlapping with the location 131 of the first wafer 121, and a location 134 overlapping with the location 133 of the first wafer 121. The stress compensation layer 125 may have a non-uniformly distributed stress field that is complement to the non-uniformly distributed stress field at the surface of the two wafers, e.g., the first wafer 121 or the second wafer 123. The non-uniformly distributed stress field of the stress compensation layer 125 may be generated by varying the materials at different locations of the stress compensation layer 125. For example, the stress compensation layer 125 includes a first material at the location 132, and a second material at the location 134, where the first material is different from the second material. As a consequence, the stress compensation layer 125 induces a third stress level at the location 131 of the first wafer 121, and a fourth stress level at the location 133 of the first wafer 121, where the third stress level is different from the fourth stress level.

In embodiments, as the result of the stress compensation layer 125, the first wafer 121 has a sum stress level of the location 131 equal to the first stress level and the third stress level, and a sum stress level of the location 133 equal to the second stress level and the fourth stress level. The sum stress level of the location 131 is substantially same as the sum stress level of the location 133. Hence, the stress compensation layer 125 corrects the non-uniformly distributed stress field at the surface of the two wafers, the first wafer 121 or the second wafer 123, to be uniformly distributed.

In embodiments, as shown in FIG. 1(c), a device 150 includes the first wafer 141 and the second wafer 143 bonded together. The first wafer 141 and the second wafer 143 may be similar to the first wafer 101 and the second wafer 103 shown in FIG. 1(a). The device 150 formed by bonding the first wafer 141 and the second wafer 143 may have a non-uniformly distributed stress field at the surface of the two wafers. For example, the first wafer 141 has a first stress level at the location 151 of the first wafer 141, and a second stress level at the location 153 of the first wafer 141, where the second stress level is different from the first stress level. In embodiments, the first stress level or the second stress level may be for a compressive stress or a tensile stress, and may be around 1 MPa to around 1000 MPa. In embodiments, the stress compensation layer 145 is in contact with the first wafer 141 and the second wafer 143. The stress compensation layer 145 is in contact with an entire surface of the first wafer 141.

In embodiments, the stress compensation layer 145 may be used to compensate the non-uniformly distributed stress field at the surface of the two wafers, e.g., the first wafer 141 or the second wafer 143. The stress compensation layer 145 has a location 152 overlapping with the location 151 of the first wafer 141, and a location 154 overlapping with the location 153 of the first wafer 141. The stress compensation layer 145 may have a non-uniformly distributed stress field that is complement to the non-uniformly distributed stress field at the surface of the two wafers, e.g., the first wafer 141 or the second wafer 143. The non-uniformly distributed stress field of the stress compensation layer 145 may be generated by varying the materials at different locations of the stress compensation layer 145. For example, the stress compensation layer 145 includes a first material at the location 152, and a second material at the location 154, where the first material is different from the second material. For example, the first material includes a high stress material, and the second material includes a low stress material with a material stress constant lower than the first material. As a consequence, the stress compensation layer 145 induces a third stress level at the location 151 of the first wafer 141, and a fourth stress level at the location 153 of the first wafer 141, where the third stress level is different from the fourth stress level.

In embodiments, as the result of the stress compensation layer 145, the first wafer 141 has a sum stress level of the location 151 equal to the first stress level and the third stress level, and a sum stress level of the location 153 equal to the second stress level and the fourth stress level. The sum stress level of the location 151 is substantially same as the sum stress level of the location 153. Hence, the stress compensation layer 145 corrects the non-uniformly distributed stress field at the surface of the two wafers, the first wafer 141 or the second wafer 143, to be uniformly distributed.

FIGS. 2(a)-2(c) schematically illustrate diagrams of a stress compensation layer to compensate different stress levels at different locations resulted from bonding a first wafer 201 and a second wafer 203, in accordance with some embodiments. The first wafer 201 and the second wafer 203 may be similar to the wafer 101 and the wafer 103 as shown in FIG. 1(a).

In embodiments, as shown in FIG. 2(a), a device is formed by bonding a wafer 201 and a wafer 203. A stress field of the bonded wafer 201 and the wafer 203 is shown. The stress filed may include various stress levels shown in different shades. A heavier shade shows a larger stress level, while a lighter shade shows a smaller stress level. For example, the stress filed includes a stress level at a location 211 near a center of the wafers, a stress level at a location 213, and a stress level at a strip 215. The stress level at the location 211 is higher than the stress level at the location 213. Similarly, the stress level along the strip 215 is higher than the stress level at the location 213. Large stresses are noted at the location 211 near the wafer center, corresponding to the effect of the center initiation pin used in bonding the wafer 201 and the wafer 203. Sometimes, the various stress levels at the bonded wafer 201 and the wafer 203 may change the symmetric shape of the wafers.

In embodiments, as shown in FIG. 2(b), a stress compensation layer 205 is formed with a stress field. For example, the stress field of the stress compensation layer 205 may include a stress level at a location 221, a stress level at a location 223, and a stress level along a strip 225. The location 221 may overlap with the location 211 when the stress compensation layer 205 is in contact with the bonded wafer 201 and the wafer 203. Similarly, the location 223 may overlap with the location 213, and the strip 225 may overlap with the strip 215. The stress level at the location 221 may be smaller than the stress level at the location 223. Similarly, the stress level at the strip 225 may be smaller than the stress level at the location 223. The non-uniformly distributed stress field at the stress compensation layer 205 may be generated by ion implantation. Different stress levels may be generated by varying the ion, dosage and beam energy, e.g., argon or xenon with a dose of 5e14 to 5e16/cm2 for implantation. The ion beam is rastered with a specifically designed pattern that aims to compensate the stress field shown in FIG. 2(a). In general, a near arbitrary pattern of the stress field for the stress compensation layer 205 can be achieved by varying the ion implantation.

In embodiments, as shown in FIG. 2(c), a device 210 is formed by adding the stress compensation layer 205 to the bonded wafer 201 and the wafer 203. The stress compensation layer 205 is placed on a side such that after bonding and grinding, the stress compensation layer 205 remains in the final configuration of the device 210. A stress field of the device 210 shows a stress level at a location 231, a location 233, and a strip 235. The location 231 may overlap with the location 221 and the location 211, the location 233 may overlap with the location 223 and the location 213, while the strip 235 may overlap with the strip 225 and the strip 215. A stress level at the location 231 may be equal to a sum of the stress level at the location 221 and the stress level at the location 211, a stress level at the location 233 may be equal to a sum of the stress level at the location 223 and the stress level at the location 213, while a stress level at the strip 235 may be equal to a sum of the stress level at the strip 225 and the stress level at the strip 215. The stress level at the location 231, the stress level at the location 233, and the stress level at the strip 235 may be substantially the same. In some other embodiments, the differences of the stress levels at different locations may be reduced substantially, e.g., by more than 50%. When the shape of the of the bonded wafer 201 and the wafer 203 is changed due to the various stress levels resulted from the bonding, the stress compensation layer 205 may reduce the overall stress levels of the resulting device, and the shape of the bonded wafer 201 and the wafer 203 together with the stress compensation layer 205 may be back to the symmetric shape of the wafers.

FIGS. 3(a)-3(c) schematically illustrate diagrams of a stress compensation layer to compensate different stress levels at different locations resulted from bonding a first wafer 301 and a second wafer 303, in accordance with some embodiments. The first wafer 301 and the second wafer 303 may be similar to the wafer 101 and the wafer 103 as shown in FIG. 1(a).

In embodiments, as shown in FIG. 3(a), a device is formed by bonding the first wafer 301 and the second wafer 303. A stress field of the bonded first wafer 301 and the second wafer 303 is shown. The device may include a strip 315 with some different stress levels.

In embodiments, as shown in FIG. 3(b), a stress compensation layer 305 has a stress field as well. For example, the stress field of the stress compensation layer 305 may include various stress levels along a strip 325.

In embodiments, as shown in FIG. 3(c), a device 310 is formed by adding the stress compensation layer 305 and the bonded first wafer 301 and the second wafer 303. A stress field of the device 310 along a strip 335 shown to be equal or substantially equal to the stress levels of other locations of the device 310.

Figure 4:
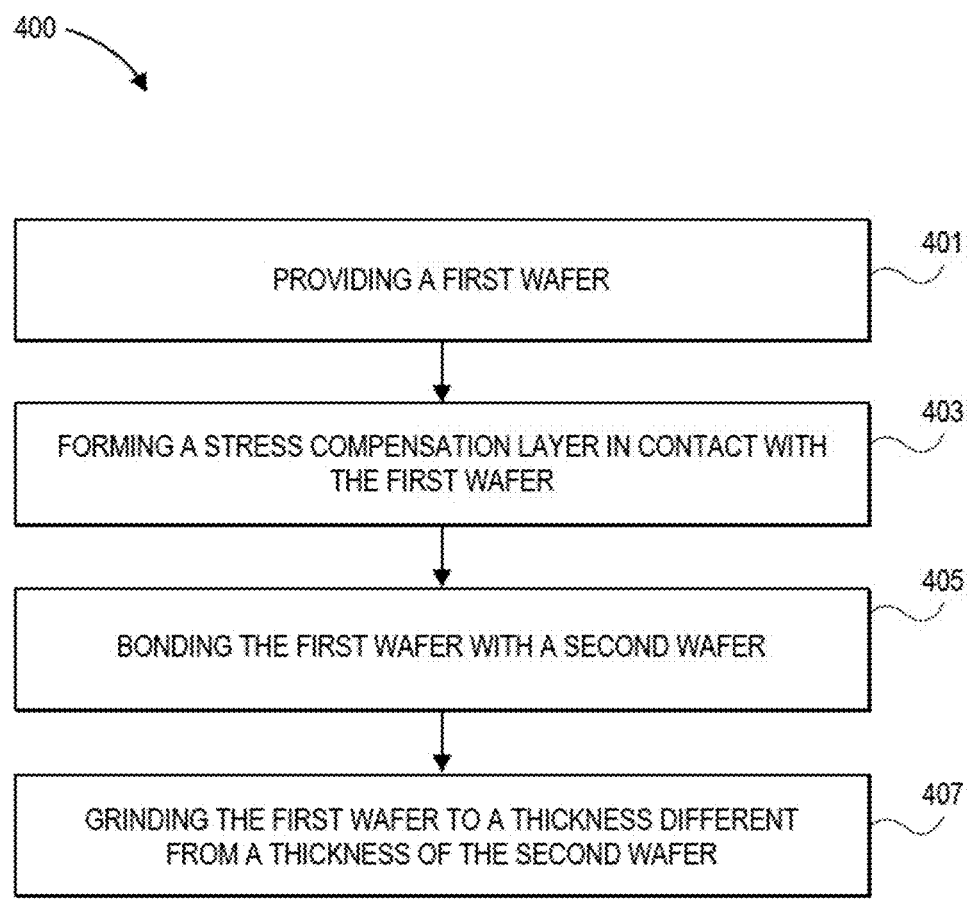
FIG. 4 schematically illustrates a process for forming a stress compensation layer to compensate different stress levels at different locations resulted from bonding a first wafer and a second wafer, in accordance with some embodiments.

FIG. 4 schematically illustrates a process 400 for forming a stress compensation layer to compensate different stress levels at different locations resulted from bonding a first wafer and a second wafer, in accordance with some embodiments. In embodiments, the process 400 may be applied to form the device 110 in FIG. 1(a), the device 130 in FIG. 1(b), or the device 150 in FIG. 1(c). Details of the operation blocks of process 400 may be further illustrated in FIGS. 5(a)-5(e) and FIGS. 6(a)-6(e).

Figure 6A:
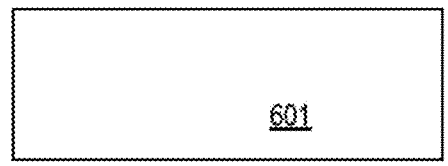
FIGS. 6(a)-6(e) schematically illustrate a process for forming a stress compensation layer to compensate different stress levels at different locations resulted from bonding a first wafer and a second wafer, in accordance with some embodiments.

At block 401, the process 400 may include providing a first wafer. For example, as shown in FIG. 5(a), the process 400 may include providing a first wafer 501. Similarly, as shown in FIG. 6(a), the process 400 may include providing a first wafer 601. The first wafer 501 or the first wafer 601 may be similar to the wafer 101 as shown in FIG. 1(a).

At block 403, the process 400 may include forming a stress compensation layer in contact with the first wafer. Different ways may be used to form such a stress compensation layer in contact with the first wafer. A stress compensation layer may be similar to the stress compensation layer 105 in FIG. 1(a).

For example, forming a stress compensation layer in contact with the first wafer may include depositing a layer of implant film in contact with the first wafer; and inducing, in the layer of implant film, by implant beam, a first material at a first location of the stress compensation layer, and a second material at a second location of the stress compensation layer. In detail, as shown in FIG. 5(b), a layer 511 of implant film may be deposited in contact with the first wafer 501. The layer 511 of implant film may include Si3N4, W, SiC, SiO2, a ceramic film, a polymer film, or a metal film. Furthermore, as shown in FIG. 5(c), a first material, e.g., ion with a first concentration level may be implanted at a first location 513, while a second material, e.g., ion with a second concentration level may be implanted at a second location 515. The ion implant may implant a dose of 5e14 to 5e16/cm2 of Argon or Xenon within the layer 511. As a result, Argon or Xenon atoms may lie beneath the surface of the layer 511 with varying concentration levels at varying depths, instead of being constant throughout the layer 511. Furthermore, the concentration levels of the ion implant at the first location 513 and the second location 515 may be different as well.

Figure 6B:
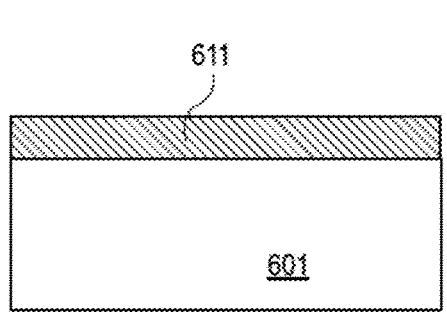
Figure 6C:
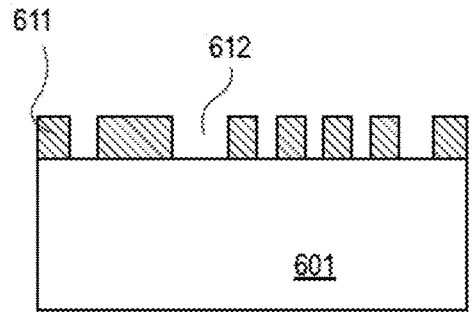
Figure 6D:
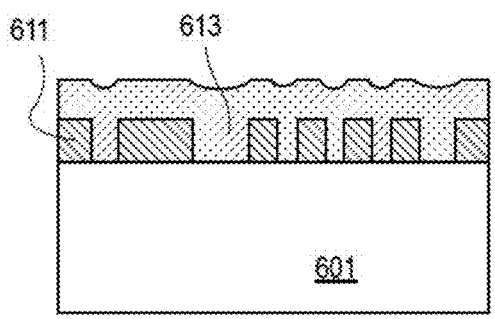
Figure 6E:
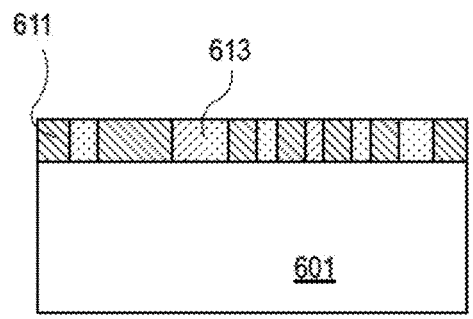

For example, forming a stress compensation layer in contact with the first wafer may be done by a lithography method, and may include depositing the stress compensation layer with a first material in contact with the first wafer; forming one or more openings of the stress compensation layer; and depositing a second material in the one or more openings. In detail, as shown in FIG. 6(b), a stress compensation layer 611 with a first material is deposited in contact with the first wafer 601. As shown in FIG. 6(c), an opening 612 is formed of the stress compensation layer 611. As shown in FIG. 6(d), a second material 613 is deposited in the opening 612. The second material 613 may cover the entire stress compensation layer 611. Furthermore, as shown in FIG. 6(e), a part of the layer formed by the second material 613 above the stress compensation layer 611 may be removed, e.g., by chemical mechanical polishing (CMP) planarization to smoothing surfaces.

At block 405, the process 400 may include bonding the first wafer with a second wafer. For example, as shown in FIG. 5(d), the process 400 may include bonding the first wafer 501 with a second wafer 503. The second wafer 503 may be similar to the wafer 103 as shown in FIG. 1(a). In detail, according to a direct fusion bonding method, the first wafer 501 and the second wafer 503 may be initially held by vacuum chucks, made planar with each other, and brought into close distance (typically ~100 um). An initiation pin strikes the second wafer 503 until the center of the second wafer 503 touches the first wafer 501. Afterwards, interfacial adhesive forces, such as van der Waals forces, pulls the second wafer 503 down, pushing out the air inside the gap between the first wafer 501 and the second wafer 503, until both wafers come into full contact. The surface adhesive forces maintain the bond of the two wafers. A subsequent anneal process may be typically performed to make the bond permanent. Direct fusion bonding typically happens in standard ambient conditions (room temperature, atmospheric pressure), and does not use a polymeric glue layers, thus allows for further CMOS processing after the first wafer 501 is bonded with the second wafer 503.

At block 407, the process 400 may include grinding a first wafer to a thickness different from a thickness of the second wafer. For example, as shown in FIG. 5(*e*), the process 400 may include grinding the first wafer 501 to a thickness different from a thickness of the second wafer 503. The first wafer 501 or the second wafer 503 may be grinded to complete the layer transfer process.

The operations shown in FIG. 4 may be performed in various orders. For example, the operations for the block 405 may be performed before the operations for the block 403 so that the second wafer is bonded to the first wafer before forming the stress compensation layer in contact with the first wafer or the second wafer.

Figure 7:
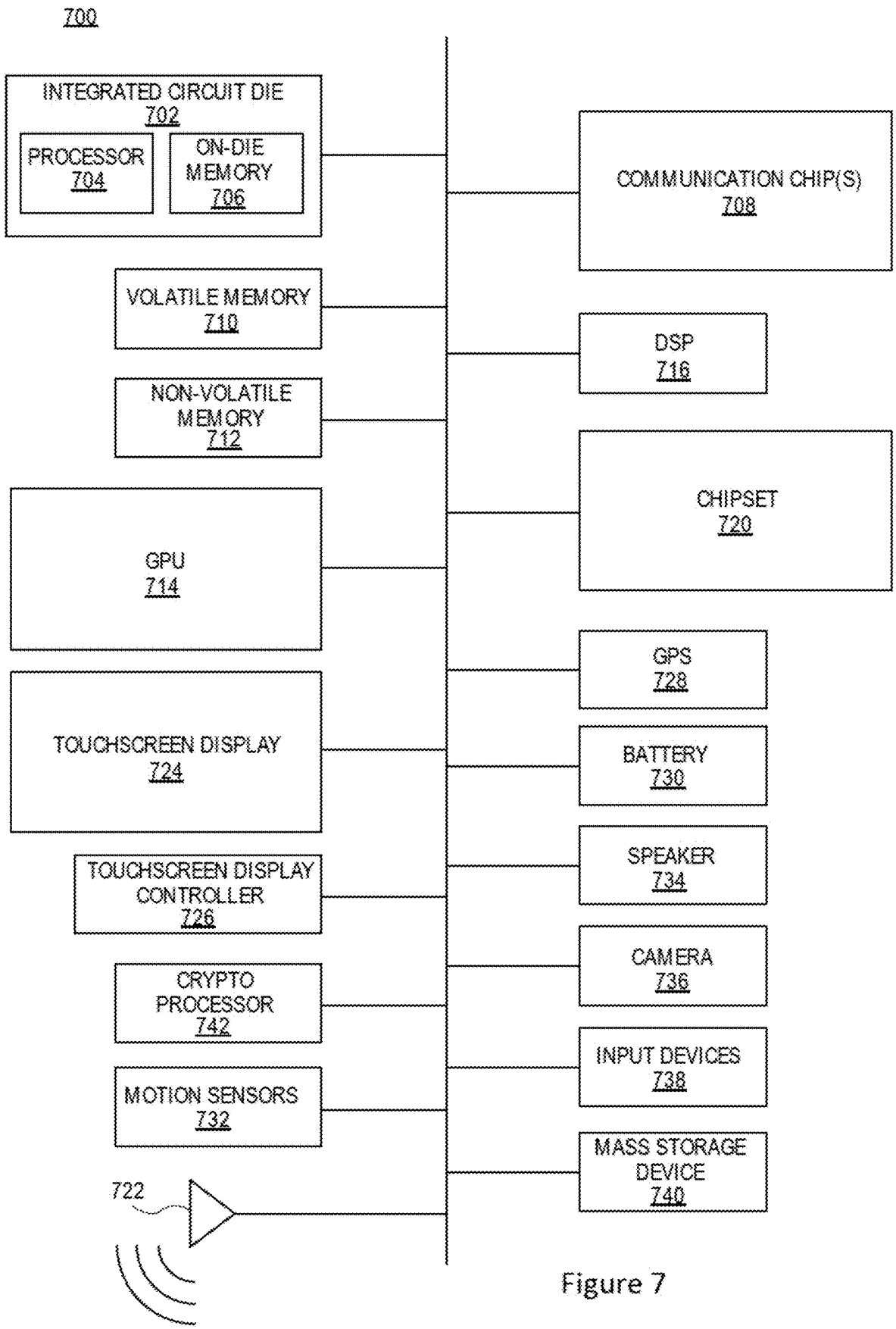
FIG. 7 schematically illustrates a computing device built in accordance with an embodiment of the disclosure, in accordance with some embodiments.

FIG. 7 illustrates a computing device 700 in accordance with one embodiment of the disclosure. The computing device 700 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 700 include, but are not limited to, an integrated circuit die 702 and at least one communications logic unit 708. In some implementations the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit die 702. The integrated circuit die 702 may include a processor 704 as well as on-die memory 706, often used as cache memory, which can be provided by technologies such as embedded DRAM (eDRAM), or SRAM. In embodiments, the processor 704 or the on-die memory 706 may be formed on the wafer 101 or the wafer 103, as shown in FIG. 1(*a*), the wafer 121 or the wafer 123, as shown in FIG. 1(*b*), or the wafer 141 or the wafer 143, as shown in FIG. 1(*c*), the wafer 501 or the wafer 503, as shown in FIG. 5(*e*).

In embodiments, the computing device 700 may include a display or a touchscreen display 724, and a touchscreen display controller 726. A display or the touchscreen display 724 may include a FPD, an AMOLED display, a TFT LCD, a micro light-emitting diode (μLED) display, or others.

The computing device 700 may include other components that may or may not be physically and electrically coupled to the motherboard or fabricated within a SoC die. These other components include, but are not limited to, volatile memory 710 (e.g., dynamic random access memory (DRAM), non-volatile memory 712 (e.g., ROM or flash memory), a graphics processing unit (GPU), a digital signal processor (DSP) 716, a crypto processor 742 (e.g., a specialized processor that executes cryptographic algorithms within hardware), a chipset 720, at least one antenna 722 (in some implementations two or more antenna may be used), a battery 730 or other power source, a power amplifier (not shown), a voltage regulator (not shown), a global positioning system (GPS) device 728, a compass, a motion coprocessor or sensors 732 (that may include an accelerometer, a gyroscope, and a compass), a microphone (not shown), a speaker 734, user input devices 738 (such as a keyboard, mouse, stylus, and touchpad), and a mass storage device 740 (such as hard disk drive, compact disk (CD), digital versatile disk (DVD), and so forth). The computing device 700 may incorporate further transmission, telecommunication, or radio functionality not already described herein. In some implementations, the computing device 700 includes a radio that is used to communicate over a distance by modulating and radiating electromagnetic waves in air or space. In further implementations, the computing device 700 includes a transmitter and a receiver (or a transceiver) that is used to communicate over a distance by modulating and radiating electromagnetic waves in air or space.

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi, NFC, and Bluetooth and a second communications logic unit 708 may be dedicated to longer range wireless communications such as GPS, EDGE, GPRS, CDMA, WiMAX, LTE, Ev-DO, and others.

The processor 704 of the computing device 700 includes one or more devices, such as transistors. The term "processor" may refer to any device or portion of a device that processes electronic data from registers and/or memory to transform that electronic data into other electronic data that may be stored in registers and/or memory. The communications logic unit 708 may also include one or more devices, such as transistors.

In various embodiments, the computing device 700 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some non-limiting Examples are provided below.

Example 1 may include an apparatus of bonded wafers, comprising: a first wafer; a second wafer bonded to the first wafer; and a stress compensation layer in contact with the first wafer or the second wafer, wherein: the first wafer has a first stress level at a first location of the first wafer, and a second stress level at a second location of the first wafer, where the second stress level is different from the first stress level; and the stress compensation layer includes a first material at a first location of the stress compensation layer overlapping with the first location of the first wafer, a second material at a second location of the stress compensation layer overlapping with the second location of the first wafer, the stress compensation layer induces a third stress level at the first location of the first wafer, and a fourth stress level at the second location of the first wafer, where the third stress level is different from the fourth stress level, and the first material is different from the second material.

Example 2 may include the apparatus of example 1, wherein the first wafer has a sum stress level of the first location equal to the first stress level and the third stress level, and a sum stress level of the second location equal to the second stress level and the fourth stress level, the sum stress level of the first location is substantially same as the sum stress level of the second location.

Example 3 may include the apparatus of examples 1-2, wherein the stress compensation layer is a first stress compensation layer, the apparatus further includes a second stress compensation layer in contact with the first wafer or the second wafer; and the first wafer has a sum stress level of the first location equal to the first stress level, the third stress level, and a fifth stress level induced by the second stress compensation layer at the first location of the first wafer, and a sum stress level of the second location equal to the second stress level, the fourth stress level, and a sixth stress level induced by the second stress compensation layer at the second location of the first wafer, and the sum stress level of the first location is substantially same as the sum stress level of the second location.

Example 4 may include the apparatus of examples 1-3, wherein the second wafer is bonded to the first wafer by direct fusion bonding, direct bonding, vacuum wafer bonding, hybrid bonding, surface activated bonding, plasma activated bonding, anodic bonding, eutectic bonding, glass frit bonding, adhesive bonding, thermocompression bonding, reactive bonding, or transient liquid phase diffusion bonding.

Example 5 may include the apparatus of examples 1-3, wherein the first stress level, the second stress level, the third stress level, and fourth stress level are for a compressive stress or a tensile stress, and are around 1 MPa to around 1000 MPa.

Example 6 may include the apparatus of examples 1-5, wherein the stress compensation layer is in contact with an entire surface of the first wafer or the second wafer.

Example 7 may include the apparatus of examples 1-6, wherein the stress compensation layer is between the first wafer and the second wafer, and in contact with both the first wafer and the second wafer.

Example 8 may include the apparatus of examples 1-6, wherein the stress compensation layer is in contact with a surface of only the first wafer, and not in contact with the second wafer.

Example 9 may include the apparatus of examples 1-6, wherein the stress compensation layer includes $Si_3N_4$, W, SiC, $SiO_2$, a ceramic film, a polymer film, or a metal film, and the stress compensation layer has a thickness of around 100 nm to around 3000 nm.

Example 10 may include the apparatus of examples 1-6, wherein the first material includes argon, xenon, or ion impurity beneath a surface of the stress compensation layer.

Example 11 may include the apparatus of example 10, wherein the argon, xenon, or ion impurity has a concentration level of about $1*10^{15}$ to $1*10^{21}/cm^2$, and the concentration level varies with a depth to the surface of the stress compensation layer.

Example 12 may include the apparatus of examples 1-10, wherein the stress compensation layer further includes only the first material at the first location of the stress compensation layer, and only the second material at the second location of the stress compensation layer.

Example 13 may include the apparatus of examples 1-10, wherein the first material includes a high stress material, and the second material includes a low stress material with a material stress constant lower than the first material.

Example 14 may include the apparatus of examples 1-10, wherein the first wafer has a thickness different from a thickness of the second wafer.

Example 15 may include a method for forming a semiconductor device, the method comprising: providing a first wafer; forming a stress compensation layer in contact with the first wafer; bonding the first wafer with a second wafer, wherein: the first wafer has a first stress level at a first location of the first wafer, and a second stress level at a second location of the first wafer, where the second stress level is different from the first stress level; and the stress compensation layer includes a first material at a first location of the stress compensation layer overlapping with the first location of the first wafer, a second material at a second location of the stress compensation layer overlapping with the second location of the first wafer, the stress compensation layer induces a third stress level at the first location of the first wafer, and a fourth stress level at the second location of the first wafer, where the third stress level is different from the fourth stress level, and the first material is different from the second material.

Example 16 may include the method of example 15, wherein the first wafer has a sum stress level of the first location equal to the first stress level and the third stress level, and a sum stress level of the second location equal to the second stress level and the fourth stress level, the sum stress level of the first location is substantially same as the sum stress level of the second location.

Example 17 may include the method of examples 15-16, wherein the forming the stress compensation layer in contact with the first wafer includes: depositing a layer of implant film in contact with the first wafer; and inducing, in the layer of implant film, by implant beam, the first material at the first location of the stress compensation layer overlapping with the first location of the first wafer, and the second material at the second location of the stress compensation layer overlapping with the second location of the first wafer.

Example 18 may include the method of examples 15-17, wherein the forming a stress compensation layer in contact with the first wafer includes: depositing the stress compensation layer in contact with the first wafer, wherein the stress compensation layer includes the first material at the first location of the stress compensation layer overlapping with the first location of the first wafer; forming an opening of the stress compensation layer at the second location of the stress compensation layer overlapping with the second location of the first wafer; and depositing the second material in the opening at the second location of the stress compensation layer overlapping with the second location of the first wafer.

Example 19 may include the method of examples 15-18, wherein the stress compensation layer is between the first wafer and the second wafer, and in contact with both the first wafer and the second wafer.

Example 20 may include the method of examples 15-19, further including: grinding the second wafer to a second thickness different from a first thickness of the first wafer.

Example 21 may include a computing device, comprising: a first wafer; a second wafer bonded to the first wafer by wafer bonding, wherein the first wafer or the second wafer includes a processor or a memory device; and a stress compensation layer in contact with the first wafer or the second wafer, wherein: the first wafer has a first stress level at a first location of the first wafer, and a second stress level at a second location of the first wafer, where the second stress level is different from the first stress level; and the stress compensation layer includes a first material at a first location of the stress compensation layer overlapping with the first location of the first wafer, a second material at a second location of the stress compensation layer overlapping with the second location of the first wafer, the stress compensation layer induces a third stress level at the first location of the first wafer, and a fourth stress level at the second location of the first wafer, the first wafer has a sum stress level of the first location equal to the first stress level and the third stress level, and a sum stress level of the second location equal to the second stress level and the fourth stress level, the sum stress level of the first location is substantially same as the sum stress level of the second location.

Example 22 may include the computing device of example 21, wherein the stress compensation layer is between the first wafer and the second wafer, and in contact with both the first wafer and the second wafer.

Example 23 may include the computing device of examples 21-22, wherein the stress compensation layer includes $Si_3N_4$, W, SiC, $SiO_2$, a ceramic film, a polymer film, or a metal film, and the stress compensation layer has a thickness of around 100 nm to around 3000 nm.

Example 24 may include the computing device of examples 21-23, wherein the first material includes argon, xenon, or ion impurity beneath a surface of the stress compensation layer, and the argon, xenon, or ion impurity has a concentration level of about $1*10^{15}$ to $1*10^{21}/cm^2$, and the concentration level varies with a depth to the surface of the stress compensation layer.

Example 25 may include the computing device of examples 21-24, wherein the computing device includes a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus of bonded wafers, comprising:
   a first wafer;
   a second wafer bonded to the first wafer; and
   a stress compensation layer between the first wafer and the second wafer, and in contact with both the first wafer and the second wafer, wherein:
   the first wafer has a first stress level at a first location of the first wafer, and a second stress level at a second location of the first wafer, where the second stress level is different from the first stress level; and
   the stress compensation layer includes a first material at a first location of the stress compensation layer overlapping with the first location of the first wafer, a second material at a second location of the stress compensation layer overlapping with the second location of the first wafer, the stress compensation layer induces a third stress level at the first location of the first wafer, and a fourth stress level at the second location of the first wafer, where the third stress level is different from the fourth stress level, and the first material is different from the second material, wherein the stress compensation layer is between the first wafer and the second wafer, and in contact with both the first wafer and the second wafer.

2. The apparatus of claim 1, wherein the first wafer has a sum stress level of the first location equal to the first stress level and the third stress level, and a sum stress level of the second location equal to the second stress level and the fourth stress level, the sum stress level of the first location is substantially same as the sum stress level of the second location.

3. The apparatus of claim 1, wherein the stress compensation layer is a first stress compensation layer, the apparatus further includes a second stress compensation layer in contact with the first wafer or the second wafer; and
   the first wafer has a sum stress level of the first location equal to the first stress level, the third stress level, and a fifth stress level induced by the second stress compensation layer at the first location of the first wafer, and a sum stress level of the second location equal to the second stress level, the fourth stress level, and a sixth stress level induced by the second stress compensation layer at the second location of the first wafer, and the sum stress level of the first location is substantially same as the sum stress level of the second location.

4. The apparatus of claim 1, wherein the second wafer is bonded to the first wafer by direct fusion bonding, direct bonding, vacuum wafer bonding, hybrid bonding, surface activated bonding, plasma activated bonding, anodic bonding, eutectic bonding, glass frit bonding, adhesive bonding, thermocompression bonding, reactive bonding, or transient liquid phase diffusion bonding.

5. The apparatus of claim 1, wherein the first stress level, the second stress level, the third stress level, and fourth stress level are a compressive stress or a tensile stress, and are around 1 MPa to around 1000 MPa.

6. The apparatus of claim 1, wherein the stress compensation layer is in contact with an entire surface of the first wafer or the second wafer.

7. The apparatus of claim 1, wherein the stress compensation layer includes $Si_3N_4$, W, SiC, $SiO_2$, or a polymer film, and the stress compensation layer has a thickness of around 100 nm to around 3000 nm.

8. The apparatus of claim 1, wherein the first material includes argon or xenon beneath a surface of the stress compensation layer.

9. The apparatus of claim 8, wherein the argon or xenon has a concentration level of about $1*10^{15}$ to $1*10^{21}/cm^2$, and the concentration level varies with a depth to the surface of the stress compensation layer.

10. The apparatus of claim 1, wherein the stress compensation layer further includes only the first material at the first location of the stress compensation layer, and only the second material at the second location of the stress compensation layer.

11. The apparatus of claim 1, wherein the first material includes a high stress material, and the second material includes a low stress material with a material stress constant lower than the first material.

12. The apparatus of claim 1, wherein the first wafer has a thickness different from a thickness of the second wafer.

13. A computing device, comprising:
a first wafer;
a second wafer bonded to the first wafer by wafer bonding, wherein the first wafer or the second wafer includes a processor or a memory device; and
a stress compensation layer between the first wafer and the second wafer, and in contact with both the first wafer and the second wafer, wherein:
the first wafer has a first stress level at a first location of the first wafer, and a second stress level at a second location of the first wafer, where the second stress level is different from the first stress level; and
the stress compensation layer includes a first material at a first location of the stress compensation layer overlapping with the first location of the first wafer, a second material at a second location of the stress compensation layer overlapping with the second location of the first wafer, the stress compensation layer induces a third stress level at the first location of the first wafer, and a fourth stress level at the second location of the first wafer,
the first wafer has a sum stress level of the first location equal to the first stress level and the third stress level, and a sum stress level of the second location equal to the second stress level and the fourth stress level, the sum stress level of the first location is substantially same as the sum stress level of the second location.

14. The computing device of claim 13, wherein the stress compensation layer includes $Si_3N_4$, W, SiC, $SiO_2$, or a polymer film, and the stress compensation layer has a thickness of around 100 nm to around 3000 nm.

15. The computing device of claim 13, wherein the first material includes argon or xenon beneath a surface of the stress compensation layer, and the argon or xenon has a concentration level of about $1*10^{15}$ to $1*10^{21}/cm^2$, and the concentration level varies with a depth to the surface of the stress compensation layer.

16. The computing device of claim 13, wherein the computing device includes a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

* * * * *